United States Patent
Takekuma et al.

(10) Patent No.: US 7,641,989 B2
(45) Date of Patent: *Jan. 5, 2010

(54) PERPENDICULAR MAGNETIC RECORDING MEDIUM FOR HIGH DENSITY RECORDING AND MANUFACTURING OF THE SAME

(75) Inventors: Ikuko Takekuma, Kanagawa (JP); Reiko Arai, Kanagawa (JP); Yoko Ogawa, Kanagawa (JP); Yoshiyuki Hirayama, Tokyo (JP); Yuzuru Hosoe, Tokyo (JP); Tomio Iwasaki, Ibaraki (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 588 days.

This patent is subject to a terminal disclaimer.

(21) Appl. No.: 11/295,005

(22) Filed: Dec. 5, 2005

(65) Prior Publication Data

US 2006/0127703 A1  Jun. 15, 2006

(30) Foreign Application Priority Data

Dec. 13, 2004  (JP) ............................. 2004-359868

(51) Int. Cl.
G11B 5/66  (2006.01)
(52) U.S. Cl. .................................................. 428/831.2
(58) Field of Classification Search ........................ None
See application file for complete search history.

(56) References Cited

U.S. PATENT DOCUMENTS

| | | | |
|---|---|---|---|
| 7,083,870 B2 * | 8/2006 | Shimizu et al. ............. 428/828 |
| 2004/0001975 A1 * | 1/2004 | Hikosaka et al. ...... 428/694 BA |
| 2005/0019608 A1 * | 1/2005 | Kim et al. ............. 428/694 BS |
| 2006/0088734 A1 * | 4/2006 | Arai et al. ................... 428/831 |
| 2006/0204791 A1 | 9/2006 | Sakawaki et al. |
| 2007/0072012 A1 * | 3/2007 | Nakamura et al. ....... 428/831.2 |
| 2007/0148499 A1 | 6/2007 | Sonobe et al. |
| 2007/0217067 A1 | 9/2007 | Nakamura et al. |

FOREIGN PATENT DOCUMENTS

JP  2003-162807  6/2003
JP  2003-178413  6/2003

OTHER PUBLICATIONS

Oikawa, T. et al., "Microstructure And Magnetic Properties Of CoPtCr Perpendicular Recording Media", IEEE Transactions on Magnetics, vol. 38, No. 5, p. 1976 (2002).
Zhen, M. et al., "Seedlayer And Preheating Effects On Crystallography And Recording Performance of CoCrPtB Perpendicular Media", IEEE Transactions on Magnetics, vol. 38, No. 5, p. 1979 (2002).
Iwasaki, T. et al., "Molecular Dynamics Analysis Of Adhesion Strength Of Interfaces Between Thin Films", Journal of Materials Research, vol. 16, pp. 1789-1794 (2001).

* cited by examiner

Primary Examiner—Holly Rickman
(74) Attorney, Agent, or Firm—Townsend and Townsend and Crew LLP; Darren Gold

(57) ABSTRACT

Embodiments of the invention provide a medium which provides high media S/N and good corrosion resistance. According to one embodiment, in a perpendicular magnetic recording medium at least comprising a soft-magnetic underlayer, a seed layer, an intermediate layer, a magnetic recording layer and an overcoat layer which are stacked over a substrate in order, the magnetic recording layer has a granular structure which consists of many columnar grains of CoCrPt alloy and a grain boundary layer containing an oxide, the seed layer is made of TaNi alloy or TaTi alloy and the intermediate layer is made of Ru or Ru alloy which contains about 80 at. % Ru or more.

11 Claims, 10 Drawing Sheets

PERPENDICULAR MAGNETIC RECORDING MEDIUM FOR HIGH DENSITY RECORDING AND MANUFACTURING OF THE SAME

CROSS-REFERENCE TO RELATED APPLICATIONS

This application claims priority from Japanese Patent Application No. JP2004-359868, filed Dec. 13, 2004, the entire disclosure of which is incorporated herein by reference.

BACKGROUND OF THE INVENTION

The present invention relates to a magnetic recording medium which can record a large volume of data and a method of manufacturing the same, and more particularly to a magnetic recording medium which is suitable for high density magnetic recording.

As can be understood from the recent tendency that not only personal computers but also home electric appliances incorporate compact large-capacity magnetic disk devices, demand for a larger capacity magnetic storage is growing and improvement in recording density is expected. In order to cope with this, efforts to develop new magnetic heads and magnetic recording media have been vigorously made. However, it is difficult to improve the recording density using the current commercial longitudinal magnetic recording system. Therefore, research has been made on perpendicular magnetic recording as an alternative to the longitudinal recording system. Perpendicular recording is considered to be essentially suitable for high density recording because neighboring magnetizations do not face each other and the condition of high density recording is stable. Also, a combination of a single pole type recording head and a double-layered perpendicular magnetic recording medium with a soft-magnetic underlayer can improve the writability and cope with an increase in coercivity of recording layer. However, it is necessary to achieve low media noise performance and high thermal stability in order to realize high density recording based on the perpendicular recording system.

For the recording layer of a perpendicular magnetic recording medium, research has been made on the use of CoCrPt alloy film which has been used for longitudinal magnetic recording media. In order to achieve low media noise performance using CoCrPt alloy film, Cr segregation to crystal grain boundaries must be used to reduce exchange coupling between magnetic crystal grains and make the magnetic reversal unit smaller. However, if the quantity of Cr is insufficient, low noise characteristic is not obtained since the insufficient Cr makes grains unite and become larger in the course of recording layer forming process or the decrease of exchange coupling among grains is insufficient. On the other hand, if the amount of Cr is large, much Cr remains in grains and the magnetic anisotropy energy of magnetic grains declines and satisfactory thermal stability cannot be attained.

In order to solve this problem and achieve low media noise performance, for example, as disclosed in JP-A No. 178413/2003, many studies have been made on a granular type recording layer of oxide-added CoCrPt alloy. When a granular type recording layer is employed, magnetic intergrain exchange coupling is reduced by forming an oxide grain boundary layer which surrounds magnetic grains and thus a CoCrPt alloy material with a high magnetic anisotropy energy may be used regardless of the Cr concentration. Also, since the oxide grain boundary layer is discontinuous with magnetic grains in terms of crystal and has some thickness, amalgamation of grains hardly occurs in the process of forming a recording layer. For this reason, a granular type perpendicular magnetic recording medium of oxide-added CoCrPt alloy is attracting attention as a candidate for a low-noise and thermally stable perpendicular magnetic recording medium. So far many researches have been made on the seed layer and intermediate layer of a perpendicular magnetic recording medium. For example, JP-A No. 162807/2003 discloses seed layers of B, C, Al, Si, P, Ti, Zr, Hf, Cr, V, Nb, Ta, Ru, Rd, Pd, Pt, Cu, Ag and Au, and NiAL and NiTa which combine these with a magnetic metal Fe, Co or Ni, and intermediate layers of Co, Cr, Pt, Pd, Rh and Ru alloy. In addition, it is reported, for example, in IEEE Transactions on Magnetics, Vol. 38, No. 5, p. 1976 (2002) that Ru is suitable for intermediate layers of oxide granular type perpendicular magnetic recording media. Also, it is reported, for example, in IEEE Transactions on Magnetics, Vol. 38, No. 5, p. 1979 (2002) that a Ta seed layer improves the crystal grain alignment of a Ru intermediate layer.

BRIEF SUMMARY OF THE INVENTION

So far, although studies have been made on the noise characteristic and thermal stability of an oxide granular type perpendicular magnetic recording medium, its corrosion resistance has not been studied sufficiently. We conducted a corrosion resistance test on oxide granular type perpendicular magnetic recording media which use a Ta seed layer and a Ru intermediate layer and provide a high media S/N, and many pit corrosions were observed and it has been found that they had the problem of corrosion resistance. When non-magnetic CoCr alloy well known as a material for the intermediate layer of the conventional longitudinal magnetic recording medium was used for the intermediate layer instead of Ru, corrosion resistance was improved but the media S/N drastically declined. In short, it has been found that the combination of the conventional known intermediate layer material and seed layer material cannot provide both high media S/N and corrosion resistance.

A feature of the present invention is to realize a perpendicular magnetic recording medium with a granular type recording layer of oxide-added CoCrPt alloy which provides both high media S/N and good corrosion resistance, by selective combination of intermediate layer and seed layer materials and structures.

According to one aspect of the present invention, in a perpendicular magnetic recording medium at least comprising a soft-magnetic underlayer, a seed layer, an intermediate layer, a magnetic recording layer and an overcoat layer which are stacked over a substrate in order, the magnetic recording layer has a granular type structure which consists of many columnar grains of CoCrPt alloy and a grain boundary layer containing an oxide, the seed layer is made of TaNi alloy or TaTi alloy and the intermediate layer is made of Ru or Ru alloy which contains 80 at. % Ru or more. The granular type perpendicular magnetic recording medium in the present invention provides high media S/N and good corrosion resistance through a combination of a TaNi alloy or TaTi alloy seed layer and a Ru or Ru alloy intermediate layer. When the intermediate layer, which is in contact with the seed layer, is made of Ru or Ru alloy with high crystal grain alignment, better corrosion resistance can be achieved. This perpendicular magnetic recording medium is characterized in that full width at half-maximum $\Delta\theta_{50}$ of the Rocking curves of the Ru (0002) diffraction peak measured with X-ray diffraction is about 4 degrees or less. In addition, it is desirable that the seed layer is made of TaNi alloy which contains Ni in the range from about 20 at. % to 80 at. % or TaTi alloy which contains Ti in the range from about 10 at. % to 40 at. %.

For improvement in the corrosion resistance of a perpendicular magnetic recording medium, it may be effective to use a corrosion resistant material for each layer of the medium. However, it has been found that even when materials with equal corrosion resistance are used, the medium's corrosion resistance considerably differs. As a result of detailed examinations, it has been found that the combination of materials rather than the corrosion resistance of each material influences the medium's corrosion resistance. The electrical and chemical properties and adhesion between materials are thought to be important factors which determine the corrosion resistance. For adhesion between materials, not only the combinations of materials but also crystallinity are thought to be important factors. The present invention is characterized by achieving good corrosion resistance through a combination of TaNi alloy or TaTi alloy and Ru and is based on the finding that control of crystal grain alignment of Ru is important.

On the other hand, in order to achieve high media S/N, the surface roughness of the intermediate layer on the recording layer side must be increased to promote oxide segregation to grain boundaries of the magnetic recording layer. In short, in order to achieve both high media S/N and good corrosion resistance at the same time, it is necessary to use an intermediate layer which is good in crystal grain alignment and has an enough surface roughness. For realization of such an intermediate layer, in a method of manufacturing a perpendicular magnetic recording medium in the present invention, a lower intermediate layer and an upper intermediate layer are stacked by different deposition conditions to constitute an intermediate layer of Ru or Ru alloy and the gas pressure for forming the upper intermediate layer is higher than that for forming the lower intermediate layer. It is desirable that the gas pressure for forming the lower intermediate layer is in the range from about 0.3 Pa to 1 Pa. Instead of using different gas pressures for forming the lower and upper intermediate layers, different deposition rates may be used to produce a similar effect. If that is the case, the lower intermediate layer should be made at a higher deposition rate than the upper intermediate layer. Also, both the gas pressure and deposition rate may be changed in forming the lower and upper intermediate layers.

According to the present invention, an oxide granular type perpendicular magnetic recording medium provides both high media S/N and good corrosion resistance by selective combination of a Ru or Ru alloy intermediate layer and a TaNi or TaTi alloy seed layer.

BRIEF DESCRIPTION OF THE DRAWINGS

FIG. 1-2 is a drawing which shows the structure of a perpendicular magnetic recording medium according to another embodiment of the present invention.

FIG. 2-1 is a drawing which shows a method of manufacturing a perpendicular magnetic recording medium.

FIG. 2-2 is a drawing which shows another method of manufacturing a perpendicular magnetic recording medium.

FIG. 2-3 is a drawing which shows another method of manufacturing a perpendicular magnetic recording medium.

FIG. 2-4 is a drawing which shows another method of manufacturing a perpendicular magnetic recording medium.

FIG. 2-5 is a drawing which shows another method of manufacturing a perpendicular magnetic recording medium.

FIG. 2-6 is a drawing which shows another method of manufacturing a perpendicular magnetic recording medium.

FIG. 3 is a drawing which shows the relation between full width at half-maximum $\Delta\theta_{50}$ of the Rocking curves of the Ru (0002) diffraction peak and pit corrosion count.

FIG. 4 is a drawing which shows the relation between Ar gas pressure and full width at half-maximum $\Delta\theta_{50}$ of the Rocking curves of the Ru (0002) diffraction peak in the formation of a lower intermediate layer.

FIG. 5 is a drawing which shows the relation among Ni content in the TaNi seed layer of a perpendicular magnetic recording medium, pit corrosion count and media S/N.

FIG. 6 is a drawing which shows the relation among Ti content in the TaTi seed layer of a perpendicular magnetic recording medium, pit corrosion count and media S/N.

DETAILED DESCRIPTION OF THE INVENTION

A perpendicular magnetic recording medium was prepared using a sputter apparatus (C3010) made by ANELVA. This sputter apparatus consists of ten process chambers and one disk load/unload chamber, where each chamber is independently evacuated. All the chambers have an air evacuation capacity of $6 \times 10^{-6}$ Pa or less.

The grain boundary width of crystal grains was calculated by observing a bright field image of the magnetic recording layer with a Transmission Electron Microscope. In a bright field image of the granular medium, the crystal grain part has a dark contrast due to strong diffraction intensity and the grain boundary (oxide) part has a bright contrast due to weak diffraction intensity. The width of each grain boundary was calculated by drawing a line to connect the center-of-mass positions of neighboring crystal grains and measuring the length of a grain boundary part on the line. Grain boundary widths of 100 or more grain boundaries were calculated and their arithmetic average was calculated to obtain an average grain boundary width.

Recording/reproducing characteristics were evaluated using a spin stand. The head used for this evaluation was a head with a single-pole type (SPT) writer and a giant-magnetoresistive type (GMR) reader. The shield-gap length is 55 nm, and the read width is 120 nm, and the write width is 170 nm. Read output and noise were measured under the condition that the relative velocity between head and medium was 10 m/s, the skew angle 0°, and the magnetic spacing about 15 nm; and the media S/N was calculated as the ratio of isolated signal amplitude at a linear density of 1970 fr/mm to integrated medium noise when 23620-fr/mm signals were recorded.

Corrosion resistance was evaluated with the following procedure. First, samples were left in a high-temperature high-humidity condition (60° C. temperature and 90% relative humidity or higher) for 96 hours. Then, pit corrosions in an area from 14 mm radius to 25 mm radius were counted and the samples were ranked as follows. The pit corrosion count of less than 50 corresponds to rank A; 50 or more and less than 200 to rank B; 200 or more and less than 500 to rank C; and 500 or more to rank D. For practical use, it is desirable for the medium to provide rank B or higher corrosion resistance.

Next, specific embodiments of the present invention will be described, referring to drawings.

Embodiment 1

Figure 1:
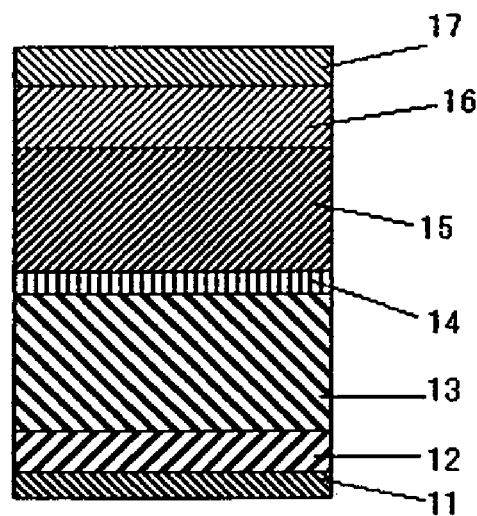
FIG. 1-1 is a drawing which shows the structure of a perpendicular magnetic recording medium according to an embodiment of the present invention.

As shown in FIG. 1-1, a perpendicular magnetic recording medium in this embodiment has a structure in which a pre-coat layer 12, a soft-magnetic underlayer 13, a seed layer 14, an intermediate layer 15, a magnetic recording layer 16 and an overcoat layer 17 are stacked over a substrate 11. The substrate 11 was a glass substrate with a thickness of 0.635 mm and a diameter of 65 mm. First, a Ni-37.5 at. % Ta-10 a. % Zr pre-coat layer 12 was formed and a Co-8 at. % Ta-5 at. % Zr film with an overall thickness of 100 nm was made over it as the soft-magnetic underlayer 13. The soft-magnetic underlayer 13 consisted of two layers which were antiferromagnetically connected through Ru. After formation of the soft-magnetic underlayer 13, a seed layer 14 and an intermediate layer 15 were formed and a 12.4 nm thick magnetic recording layer 16 of Co-17 at. % Cr-14 at. % Pt alloy to which 17.5 vol % of Si oxide is added, and a 4 nm thick CN overcoat layer 17 were formed over it. Ar was used as sputter gas and for forming the magnetic recording layer, oxygen was added at a partial pressure of 20 mPa. For forming the overcoat layer 17, the film was deposited at an Ar pressure of 0.6 Pa and nitrogen was added at a partial pressure of 50 mPa.

For the purpose of investigating a combination of an intermediate layer and a seed layer on recording/reproducing characteristics and corrosion resistance, different samples which use different seed layer and intermediate layer combinations were prepared. The seed layer and intermediate layer thicknesses and the film deposition conditions were the same for all the samples. The seed layer thickness and the intermediate layer thickness were respectively 1 nm and 16 nm and the seed layers were formed at an Ar gas pressure of 0.6 Pa and a deposition rate of 1 nm/s and the intermediate layers were formed at an Ar gas pressure of 2 Pa and a deposition rate of 0.3 nm/s. Table 1 shows the materials of the seed layers and intermediate layers of the prepared samples and the results of evaluation of their media S/N and corrosion resistance.

TABLE 1

| Sample | Composition of intermediate layer (at. %) | Composition of seed layer (at. %) | Media S/N (dB) | Rank of corrosion resistance |
|---|---|---|---|---|
| 1-1 | Ti | none | 12.1 | B |
| 1-2 | Ti | Ta | 13.5 | C |
| 1-3 | Ti | Ta—62.5Ni | 13.2 | C |
| 1-4 | Ti | Ta—15Ti | 12.9 | C |
| 1-5 | Co—40Cr | none | 11.8 | B |
| 1-6 | Co—40Cr | Ta | 12.8 | C |
| 1-7 | Co—40Cr | Ta—62.5Ni | 12.4 | C |
| 1-8 | Co—40Cr | Ta—15Ti | 12.0 | C |
| 1-9 | Ru—5Ti | none | 14.8 | C |
| 1-10 | Ru—5Ti | Ta | 16.6 | D |
| 1-11 | Ru—5Ti | Ta—62.5Ni | 16.1 | B |
| 1-12 | Ru—5Ti | Ta—15Ti | 16.4 | B |
| 1-13 | Ru | none | 16.0 | C |
| 1-14 | Ru | Ta | 17.6 | D |
| 1-15 | Ru | Ta—62.5Ni | 17.2 | B |
| 1-16 | Ru | Ta—15Ti | 17.1 | B |

First, taking a look at the media S/N, samples 1-9 to 1-16, which use Ru or Ru alloy for the intermediate layer, achieve higher media S/N than samples 1-1 to 1-8, which use Ti or CoCr alloy for the intermediate layer. As a result of measurement of sample 1-2 with a transmission electron microscope, the crystal grain width of its magnetic recording layer was 0.4 nm. On the other hand, the crystal grain boundary width of sample 1-14, which achieves the highest media S/N, was 1.1 nm, a considerable increase in the crystal grain boundary width as compared with sample 1-2. The crystal grain boundary width of samples 1-1 and 1-3 to 1-8 was measured and it was found that for samples 1-1 to 1-8, which were low in media S/N, the crystal grain width was all below 0.5 nm. For a perpendicular magnetic recording medium with a granular type magnetic recording layer of oxide-added CoCrPt alloy, the width of oxide crystal grain boundaries must be increased in order to obtain high media S/N. For this purpose, Ru or Ru alloy is suitable for the intermediate layer.

Next, the results of evaluation of corrosion resistance will be discussed. Among samples 1-1 to 1-8, which use Ti or CoCr alloy for the intermediate layer, while the samples with no seed layer showed a relatively good corrosion resistance, the samples which use a Ta or Ta alloy seed layer showed poor corrosion resistance. In any case, the problem is that both high corrosion resistance and high S/N were not achieved due to low media S/N, as mentioned above. On the other hand, among samples 1-9 to 1-16, which use Ru or Ru alloy for the intermediate layer and provide high media S/N, corrosion resistance ranking varies greatly depending on the seed layer. For samples 1-10 and 1-14, which use a Ta seed layer, their media S/N is high but their corrosion resistance is very poor, or ranked D. It has been found that although the Ta seed layer is very effective in improving the crystal grain alignment of the Ru intermediate layer and obtaining high media S/N, the problem of corrosion resistance arises when it is combined with a Ru intermediate layer. On the contrary, samples 1-11, 1-12, 1-15 and 1-16 use Ta alloy to which Ni or Ti is added, namely Ta-62.5 at. % Ni alloy or Ta-15 at. % Ti alloy, for their seed layers. The combination of a TaNi alloy or TaTi alloy seed layer and a Ru or Ru alloy intermediate layer achieved good corrosion resistance (rank B or higher) while maintaining high media S/N as in the case of Ta seed layers. It can be thought that the addition of Ni or Ti to Ta in the seed layer improved the crystal compatibility in interfaces with the Ru intermediate layer and, as a consequence, improved the degree of adhesion between the seed layer and the intermediate layer and corrosion resistance.

The first embodiment used a magnetic recording layer of Co-17 at. % Cr-14 at. % Pt alloy to which 17.5 vol % of Si oxide is added. Also, when the ratio of Si oxide was changed to 15 vol. % and 20 vol. % or CoCrPt alloys with different compositions, Co-15 at. % Cr-14 at. % Pt, Co-19 at. % Cr-14 at. % Pt and Co-17 at. % Cr-16 at. % Pt, were used, the same tendency as in the first embodiment was observed. For the oxide to be added to the magnetic recording layer, various materials were examined and as a consequence, the same tendency as in the first embodiment was observed in Al oxide, Ti oxide, Ta oxide and B oxide. It suggests that when a material which allows an oxide to be produced stably and is suitable for formation of about 1 nm-wide crystal grain boundaries is added to the magnetic recording layer, the effect of the present invention is demonstrated clearly.

Table 2 shows the calculated results of adhesion strength for the interface between an intermediate layer and a seed layer (indicated as interface 1 in Table 2) and the interface between a seed layer and a soft-magnetic underlayer (indicated as interface 2 in Table 2). These calculated results were obtained with molecular dynamics simulation. For the calculation, the material of the intermediate layer was Ru, the material of the soft-magnetic underlayer was Co-8 at. % Ta-5 at. % Zr, and the material of the seed layer was thus varied. The calculation was carried out in a method disclosed in Journal of Materials Research Vol. 16, pp. 1789-1794 (2001).

TABLE 2

| Composition of seed layer (at. %) | Adhesive fracture energy of interface 1 (J/m²) | Adhesive fracture energy of interface 2 (J/m²) |
| --- | --- | --- |
| Ta | 1.4 | 1.3 |
| Ta—62.5Ni | 2.2 | 2.6 |
| Ta—25Ti | 2.1 | 2.3 |

When Ta-62.5 at. % Ni or Ta-25 at. % Ti was used for the seed layer, the adhesive fracture energy in any interface was almost twice higher than when the Ta seed layer was used. From this simulation result, it may be considered that the use of a TaNi seed layer or TaTi seed layer increased the adhesion strength in the interface between the seed layer and the soft-magnetic underlayer and the interface between the seed layer and the Ru intermediate layer, and improved corrosion resistance.

Embodiment 2

Figures 1, 2:
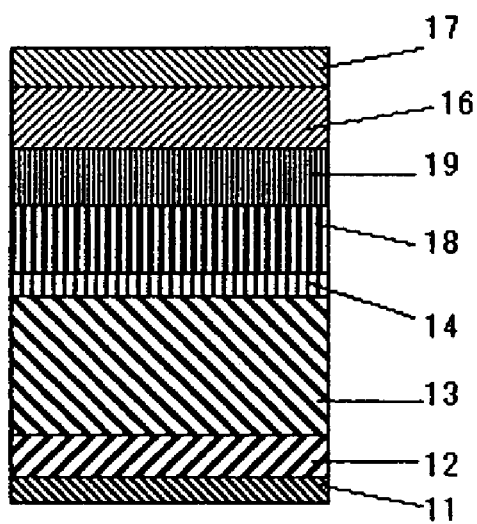

Samples 2-1 to 2-4 (perpendicular magnetic recording media) have the same layer constitution as sample 1-15 in the first embodiment and were prepared under the same conditions as sample 1-15 except the intermediate layer deposition method. Samples 2-1 and 2-2 have a constitution as shown in FIG. 1-1 and samples 2-3 and 2-4 have a constitution as shown in FIG. 1-2. The constitution of FIG. 1-2 is the same as that of FIG. 1-1 except the intermediate layer 15 and uses a lower intermediate layer 18 and an upper intermediate layer 19 laid over it instead of the intermediate layer 15.

FIGS. 2-1 to 2-4 respectively show manufacturing methods for samples 2-1 to 2-4. While samples 2-1 and 2-2 use one film deposition process to form an intermediate layer, samples 2-3 and 2-4 use different film deposition processes to form a lower intermediate layer and an upper intermediate layer. The thickness of the intermediate layer for samples 2-1 and 2-2 was 16 nm. The thickness of the upper intermediate layer and that of the lower intermediate layer for samples 2-3 and 2-4 were both 8 nm.

Table 3 shows the following types of data for each sample: seed layer material; drawing number corresponding to the manufacturing method; crystal grain boundary width of the magnetic recording layer as calculated through a transmission electron microscope; full width at half-maximum $\Delta\theta_{50}$ of the Rocking curves of the Ru (0002) diffraction peak, measured with X-ray diffraction; media S/N; and corrosion resistance evaluation results.

TABLE 3

Figures 1, 2:
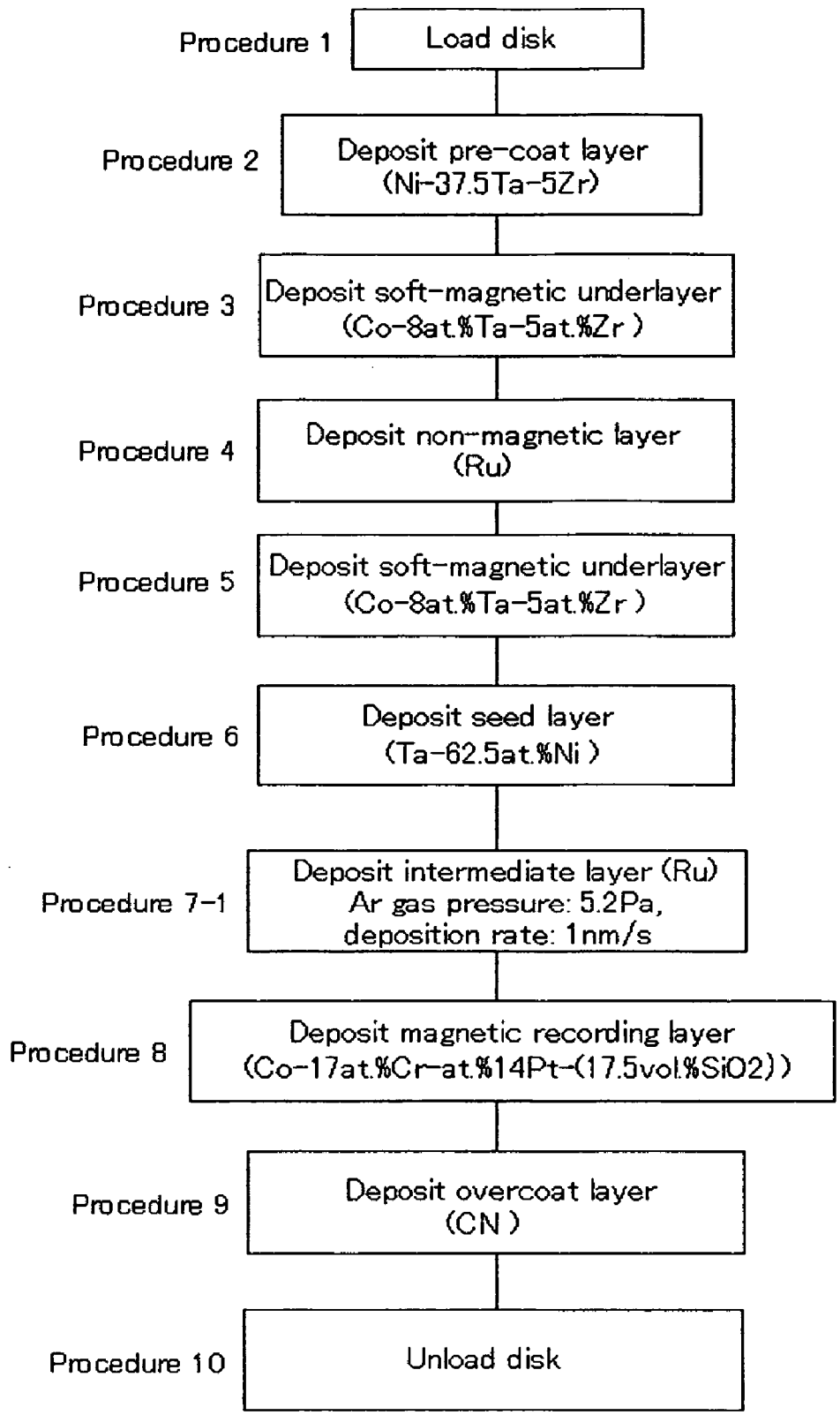
Figure 2:
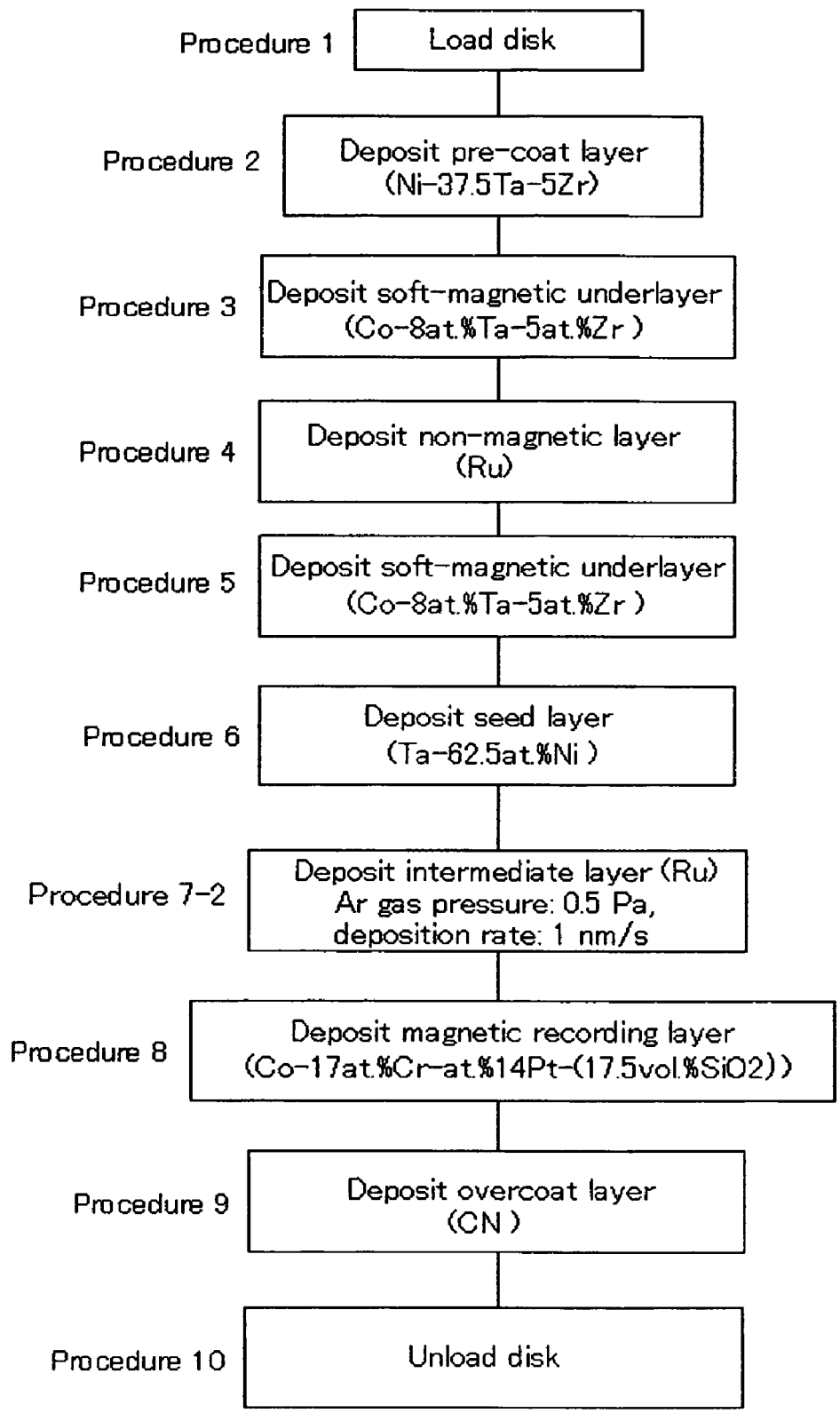
Figures 2, 3:
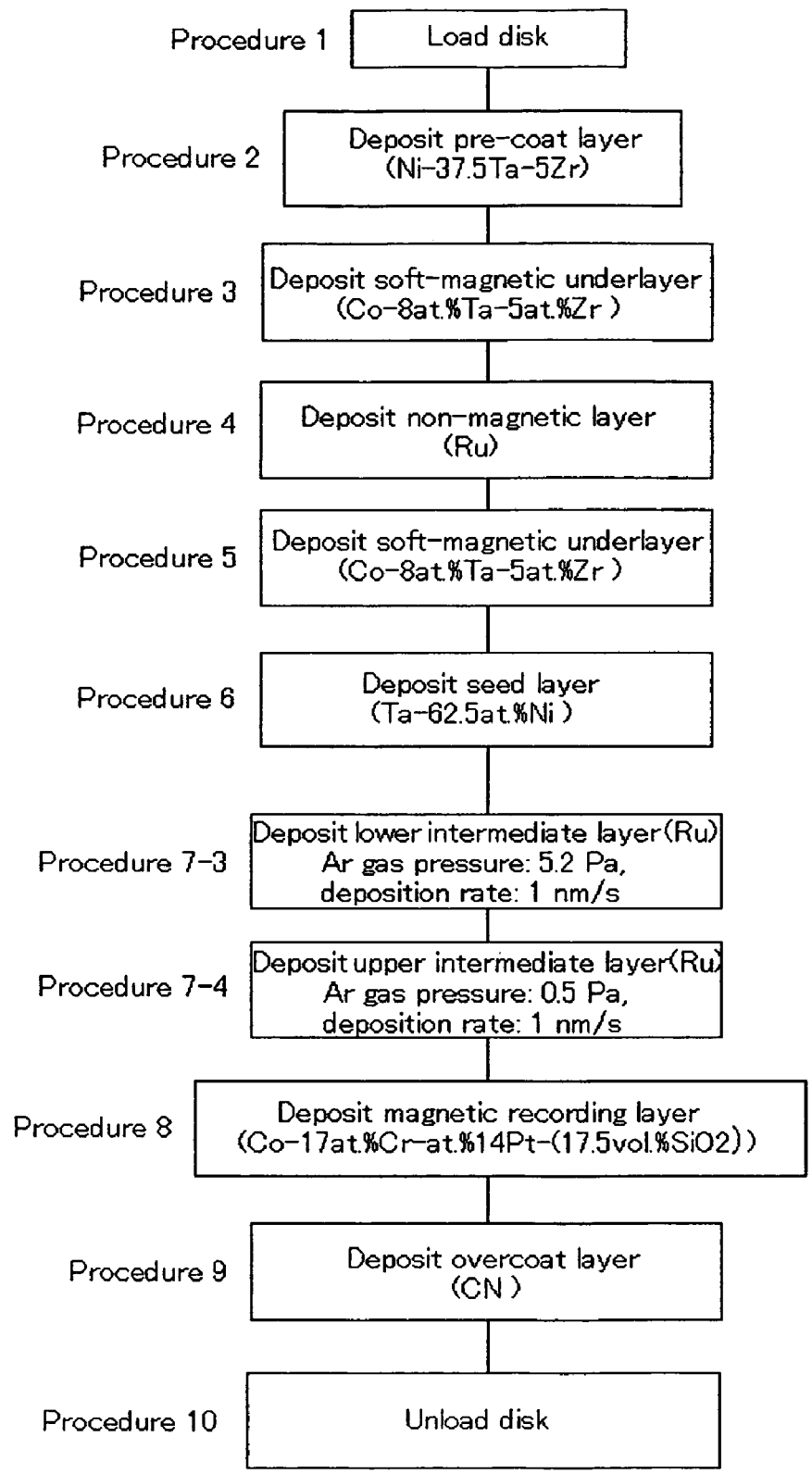
Figures 2, 3, 4:
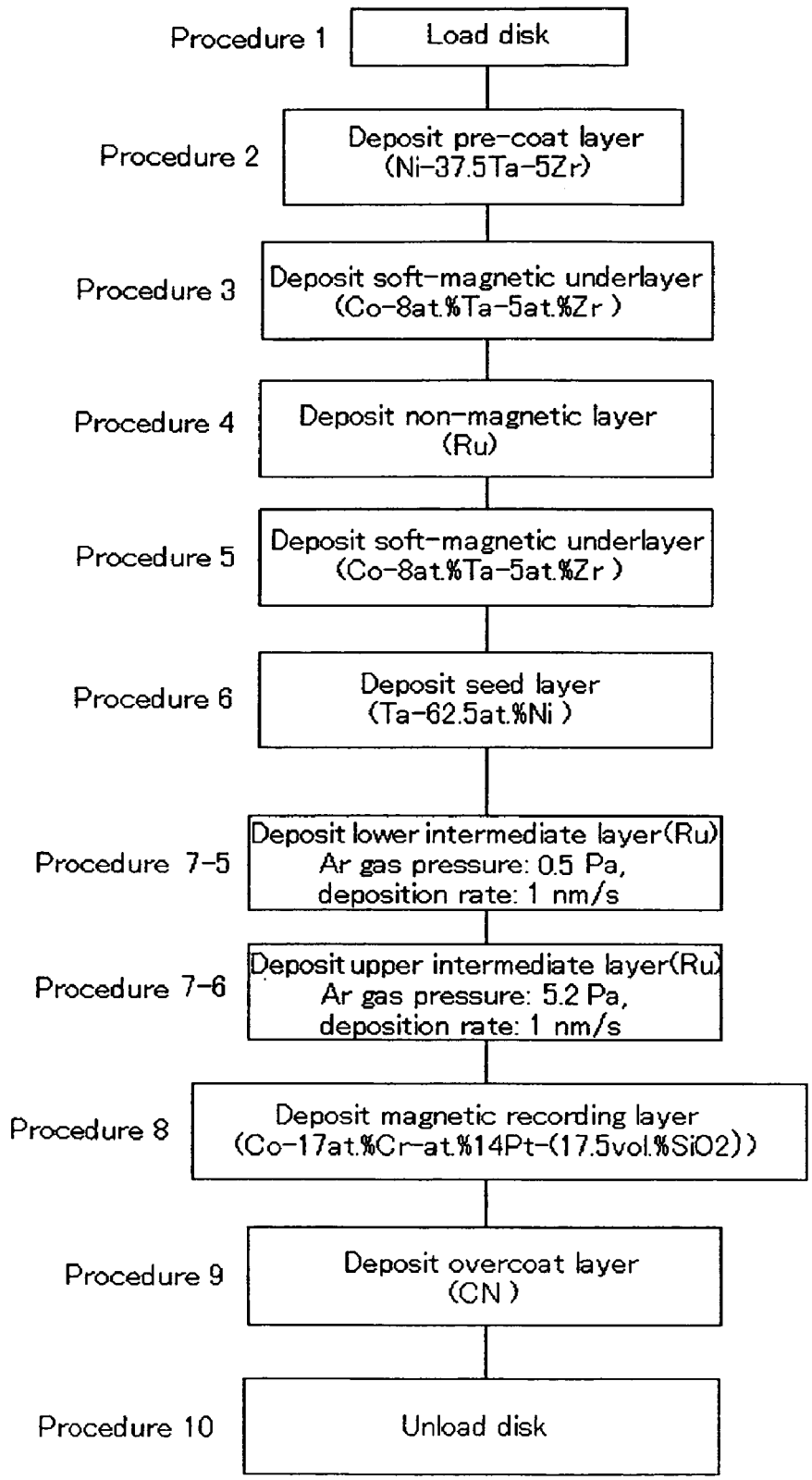
Figures 2, 3, 4, 5:
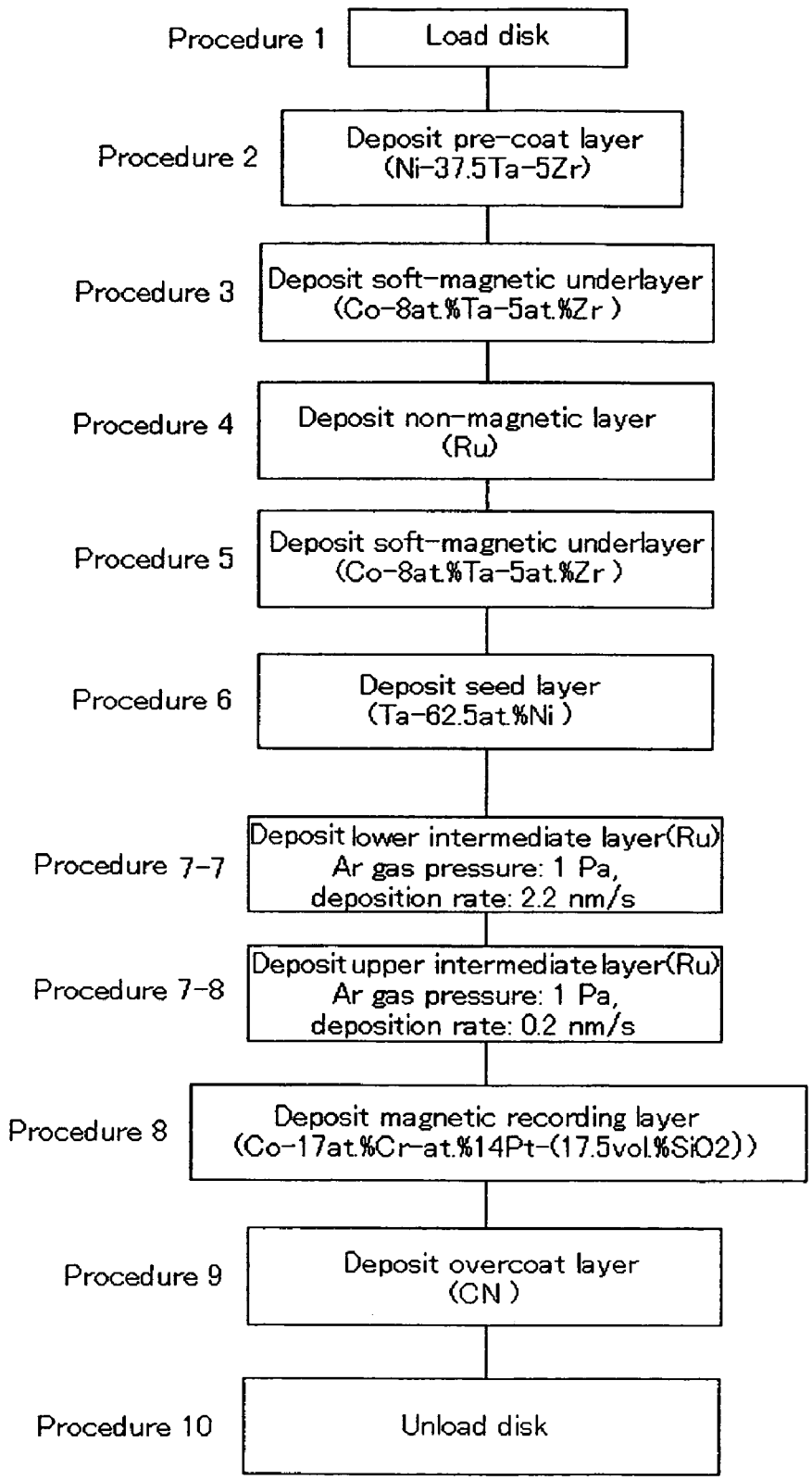
Figures 2, 3, 4, 5, 6:
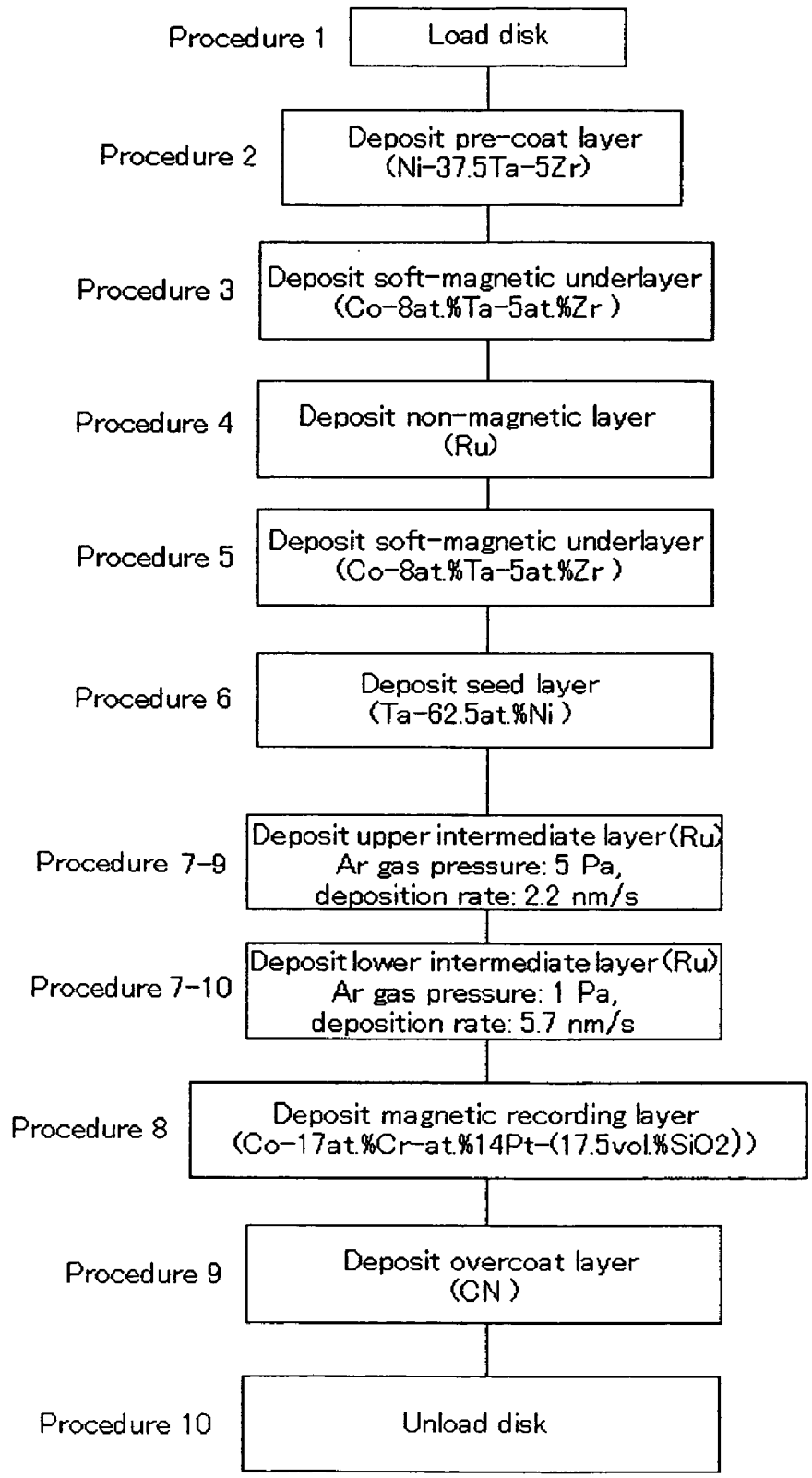
Figure 3:
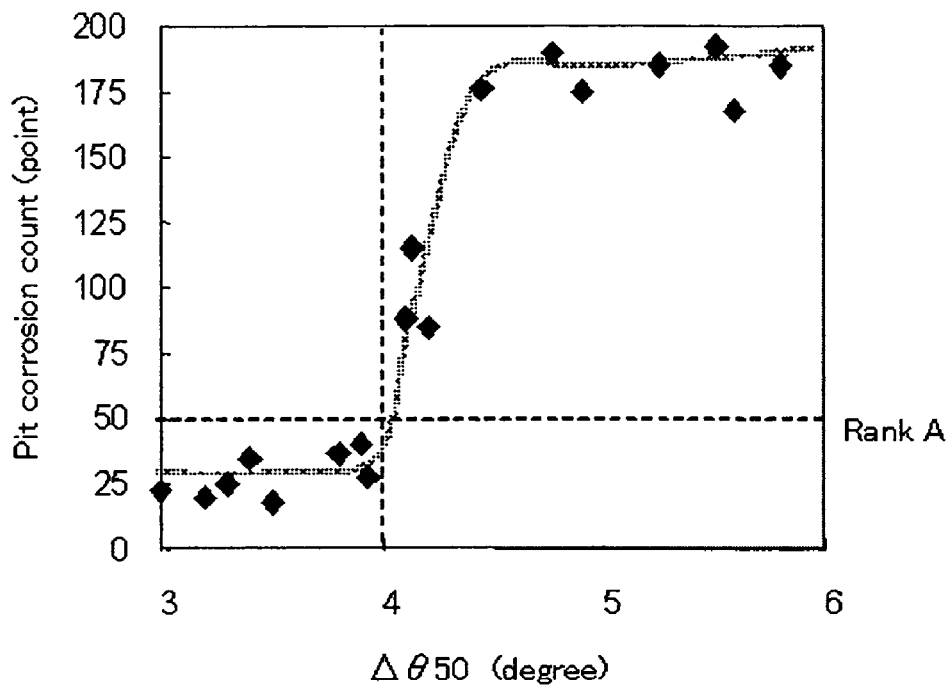
Figure 4:
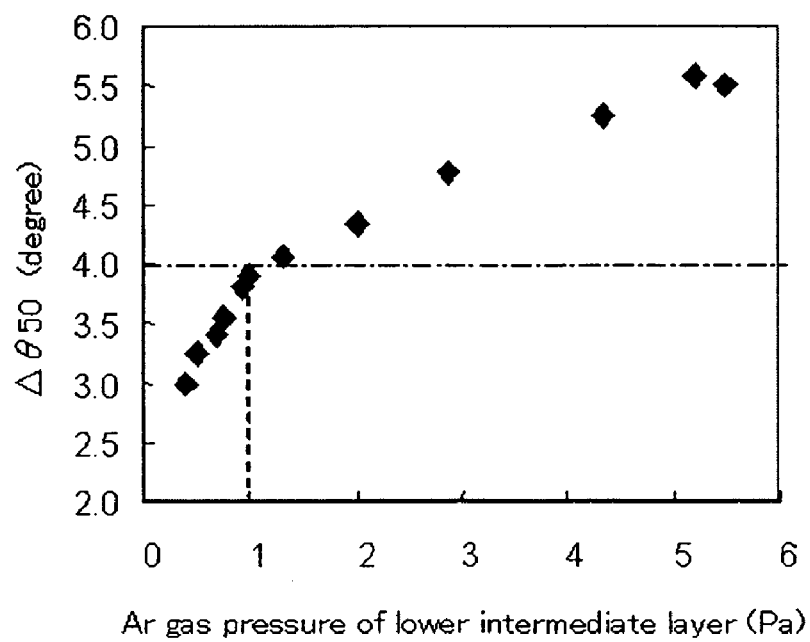
Figure 5:
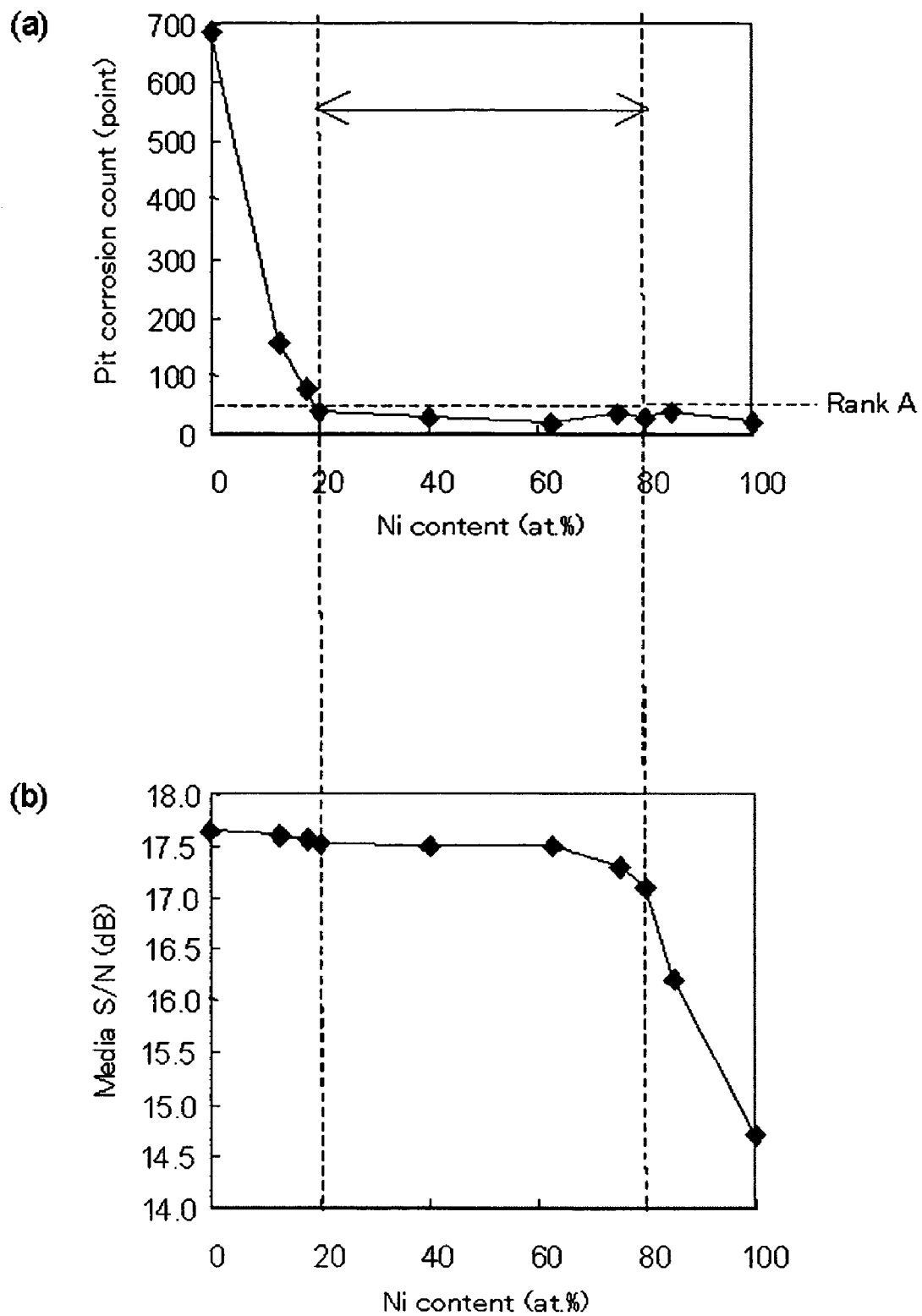
Figure 6:
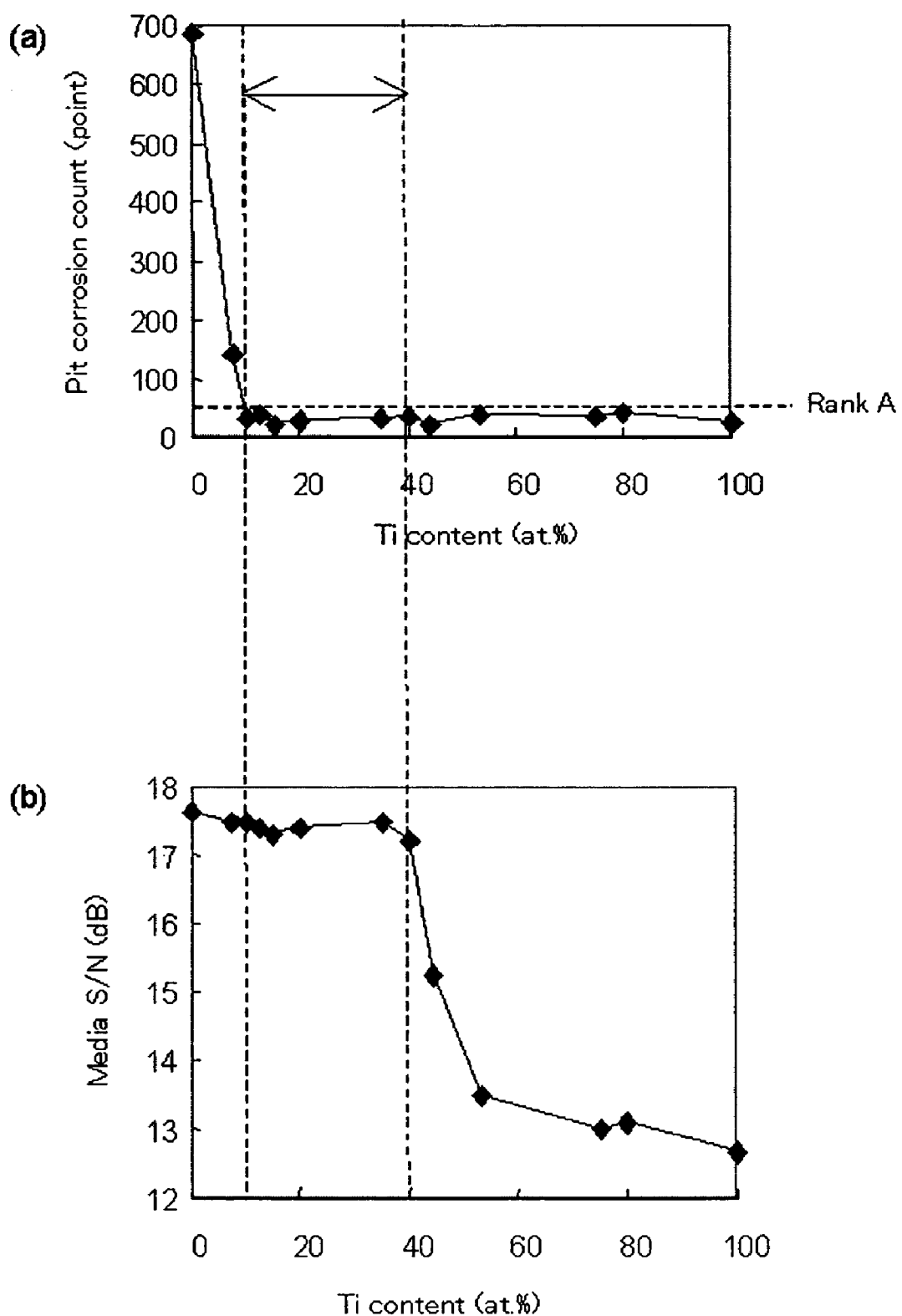

| Sample | Manufacture method | Composition of seed layer (at. %) | Crystal grain boundary width (nm) | $\Delta\theta_{50}$ (degrees) | Media S/N (dB) | Rank of corrosion resistance |
| --- | --- | --- | --- | --- | --- | --- |
| 2-1 | FIG. 2-1 | Ta—62.5Ni | 1.1 | 4.5 | 17.1 | B |
| 2-2 | FIG. 2-2 | Ta—62.5Ni | 0.4 | 3.0 | 14.4 | A |
| 2-3 | FIG. 2-3 | Ta—62.5Ni | 0.5 | 4.1 | 14.9 | B |
| 2-4 | FIG. 2-4 | Ta—62.5Ni | 1.0 | 3.4 | 17.6 | A |
| 2-5 | FIG. 2-5 | Ta—15Ti | 1.1 | 3.6 | 17.3 | A |
| 2-6 | FIG. 2-6 | Ta—62.5Ni | 1.0 | 3.1 | 16.9 | A |
| 2-7 | FIG. 2-7 | Ta—62.5Ni | 1.0 | 3.5 | 17.7 | A |

First, taking a look at the corrosion resistance results, there was difference in the results of evaluation of corrosion resistance though all the samples used the same materials for the intermediate layer and seed layer. Samples 2-2 and 2-4 were ranked A in corrosion resistance, and their $\Delta\theta_{50}$ was small, namely their crystal grain alignment was good.

A sample which has the same layer constitution as sample 2-1 was prepared using a different film deposition process for the intermediate layer. FIG. 3 shows the relation between the full width at half-maximum $\Delta\theta_{50}$ of the Rocking curves of the Ru (0002) diffraction peak and corrosion resistance for that sample. When $\Delta\theta_{50}$ is about 4 degrees or below, namely crystal grain alignment is high, good corrosion resistance (rank A or higher) is achieved. This means that for improvement in corrosion resistance, not only the combination of film materials but also crystal grain alignment are important.

Next, taking a look at the media S/N, the crystal grain boundary width of the magnetic recording layer is small and the media S/N is low for samples 2-2 and 2-3 whose intermediate layer or upper intermediate layer in contact with the magnetic recording layer was formed in a low gas pressure atmosphere. The reason for this may be that the intermediate layer deposited in a low gas pressure atmosphere hardly form surface roughness and therefore oxide segregation to crystal grain boundaries in the magnetic recording layer hardly occurs. From these results, in order to achieve both high media S/N and good corrosion resistance at the same time, the intermediate layer which is in contact with the seed layer should have high crystal grain alignment and the intermediate layer which is in contact with the recording layer should have a large surface roughness.

In order to form an intermediate layer characterized as mentioned above, the intermediate layer should consist of a lower intermediate layer and an upper intermediate layer which are formed by different methods, like sample 2-4, and the lower intermediate layer should be deposited in a low gas pressure atmosphere and provide high crystal grain alignment. In other words, it has been found that when the Ta-62.5 at. % Ni seed layer is combined with the Ru intermediate layer and the manufacturing method as indicated in FIG. 2-4 is employed, both high media S/N and rank A corrosion resistance can be achieved at the same time.

Sample 2-5, which has the same layer constitution as sample 2-4 except the seed layer material, was prepared by the same manufacturing method as sample 2-4. It used Ta-15 at. % Ti for the seed layer. Like sample 2-4, it has been found that when the Ta-15 at. % Ti seed layer is combined with the Ru intermediate layer and the manufacturing method as indicated in FIG. 2-4 is employed, both high media S/N and rank A corrosion resistance can be achieved at the same time. Even when Ru-5 at. % Ti or Ru-10 at. % Co, Ru-15 vol. % $SiO_2$ was used for the intermediate layer instead of Ru, similar results were obtained.

Samples which are the same in the layer constitution as sample 2-4 and have their lower intermediate layers deposited at different gas pressures were prepared and an investigation was made of the relation between gas pressure and the value of full width at half-maximum $\Delta\theta_{50}$ of the Rocking curves of the Ru (0002) diffraction peak. The investigation results are shown in FIG. 4. When the gas pressure was about 1 Pa or less, $\Delta\theta_{50}$ was 4 degrees or less. Because good corrosion resistance is demonstrated when $\Delta\theta_{50}$ is about 4 degrees or less, and a gas pressure of about 0.3 Pa or more is needed for stable electric discharge, it is desirable to form the lower intermediate layer at a gas pressure between about 0.3 Pa and 1 Pa. In addition, in order to achieve high media S/N, the upper intermediate layer must be formed in a higher gas pressure atmosphere than the lower intermediate layer and it is desirable to use the gas pressure for forming the upper intermediate layer which is twice or more higher than that for forming the lower intermediate layer.

Sample 2-6 has the same layer constitution as sample 2-4 though it was prepared by a different manufacturing method. Sample 2-6 was prepared using the manufacturing method as shown in FIG. 2-5. The film deposition rate was changed instead of using different gas pressures for forming the lower intermediate layer and the upper intermediate layer. When a low deposition rate is used, an effect similar to the effect of film deposition in a high gas pressure atmosphere is obtained, surface roughness easily occurs and crystal grain alignment deteriorates. On the other hand, when a high deposition rate is used, an effect similar to the effect of film deposition in a low gas pressure atmosphere is obtained, surface roughness hardly occurs and crystal grain alignment improves. In sample 2-6, the lower intermediate layer was formed at a high deposition rate and the upper intermediate layer was formed at a low deposition rate. Like sample 2-4, sample 2-6 provided both high media S/N and rank A or good corrosion resistance. Even when Ru-5 at. % Ti or Ru-10 at. % Co, Ru-15 vol. % $SiO_2$ was used for the intermediate layer instead of Ru, similar results were obtained.

Sample 2-7 has the same layer constitution as sample 2-4 though it was prepared by a different manufacturing method. Sample 2-7 was prepared using the manufacturing method as shown in FIG. 2-6. In sample 2-7, the upper intermediate layer was made in a higher gas pressure atmosphere and at a lower deposition rate than the lower intermediate layer. Sample 2-7 provided media S/N and corrosion resistance (rank A) equivalent to those of sample 2-4. Even when Ru-5 at. % Ti or Ru-10 at. % Co, Ru-15 vol. % $SiO_2$ was used for the intermediate layer and when Ta-15 at. % Ti was used for the seed layer, similar results were obtained.

Embodiment 3

A perpendicular magnetic recording medium in the third embodiment has the same layer constitution as sample 2-4 in the second embodiment except the seed layer material and was prepared under the same deposition conditions as sample 2-4. In the third embodiment, the TaNi alloy composition of the seed layer was different. FIG. 5(a) shows the relation between seed layer composition and pit corrosion count and FIG. 5(b) shows the relation between seed layer composition and media S/N. When the TaNi alloy contained about 20 at. % Ni or more, good corrosion resistance (rank A or higher) was achieved; when it contained about 80 at. % Ni or less, high media S/N was achieved. Even when Ru-5 at. % Ti or Ru-10 at. % Co, Ru-15 vol. % $SiO_2$ was used for the intermediate layer instead of Ru, similar results were obtained.

From the above results, it is desirable that the seed layer TaNi alloy contains Ni in the range from about 20 at. % to 80 at. % in order to achieve both high media S/N and good corrosion resistance in combination with a Ru or Ru alloy intermediate layer.

Embodiment 4

A perpendicular magnetic recording medium in the fourth embodiment has the same layer constitution as sample 2-4 in the second embodiment except the seed layer material and was prepared under the same deposition conditions as sample 2-4. In the fourth embodiment, TaTi alloy was used for the seed layer and its composition was different. FIG. 6(a) shows the relation between seed layer composition and pit corrosion count and FIG. 6(b) shows the relation between seed layer composition and media S/N. When the TaTi alloy contained about 10 at. % Ti or more, good corrosion resistance (rank A or higher) was achieved; when it contained about 40 at. % Ti or less, high media S/N was achieved. Even when Ru-5 at. % Ti or Ru-10 at. % Co, Ru-15 vol. % $SiO_2$ was used for the intermediate layer instead of Ru, similar results were obtained.

From the above results, it is desirable that the seed layer TaTi alloy contains Ti in the range from about 10 at. % to 40 at. % in order to achieve both high media S/N and good corrosion resistance in combination with a Ru or Ru alloy intermediate layer.

Embodiment 5

A perpendicular magnetic recording medium in the fifth embodiment has the same layer constitution as sample 1-15 in the first embodiment except the intermediate layer material and was prepared under the same deposition conditions as sample 1-15. Specifically, Ta-62.5 at. % Ni was used for the seed layer. However, in the fifth embodiment, RuCo alloy was used for the intermediate layer. Table 4 shows the intermediate layer materials and the results of evaluation of media S/N and corrosion resistance for prepared samples. While samples 5-1 to 5-3 demonstrate high media S/N and at least rank B corrosion resistance, samples 5-4 and 5-5, which contain more than 20 at. % Co in the intermediate layer, are low in media S/N and corrosion resistance (rank C). When Ru—Ti and Ru—$SiO_2$ were used for the intermediate layer, or when Ta-15 at. % Ti was used for the seed layer, similar results were obtained.

TABLE 4

| Sample | Composition of intermediate layer (at. %) | Media S/N (dB) | Rank of corrosion resistance |
|---|---|---|---|
| 5-1 | Ru—5Co | 17.1 | B |
| 5-2 | Ru—10Co | 16.9 | B |
| 5-3 | Ru—20Co | 16.8 | B |
| 5-4 | Ru—30Co | 13.1 | C |
| 5-5 | Ru—40Co | 12.5 | C |

From the above results, in order for an oxide granular type perpendicular magnetic recording medium to achieve both high media S/N and corrosion resistance at the same time, its intermediate layer should be made of Ru alloy whose main component is Ru and it is desirable that the content of Ru is about 80 at. % or more.

Embodiment 6

A perpendicular magnetic recording medium in the sixth embodiment has the same layer constitution as sample 2-4 in the second embodiment except the soft-magnetic underlayer composition and seed layer composition and thickness, and was prepared under the same deposition conditions as sample 2-4. In the sixth embodiment, Co-5 at. % Nb-10. % Zr was used for the soft-magnetic underlayer. Table 5 shows the seed layer composition, thickness, and the results of evaluation of media S/N and corrosion resistance for prepared samples. Sample 6-1 (comparative example), which has no seed layer, is poorer in corrosion resistance and lower in media S/N than samples 6-2 to 6-14. On the other hand, in comparison among samples 6-2 to 6-14, which each have a seed layer, samples whose seed layer thickness is 1 nm or more demonstrate rank A corrosion resistance and particularly samples whose seed layer thickness is in the range from about 1 nm to 5 nm provide high media S/N. Here, the reason for deterioration in media S/N of samples with a seed layer thickness of over 5 nm is thought to be a decline in writability due to a thicker seed layer. When Ru-5 at. % Ti or Ru-10 at. % Co, Ru-15 vol. % SiO$_2$ was used for the intermediate layer, or when Ta-55 at. % Ni or Ta-10 at. % Ti was used for the seed layer, similar results were obtained.

TABLE 5

| Sample | Composition of seed layer (at. %) | Seed layer thickness (nm) | Media S/N (dB) | Rank of corrosion resistance |
|---|---|---|---|---|
| 6- | — | 0 | 15.7 | C |
| 6-2 | Ta—60Ni | 0.5 | 16.4 | B |
| 6-3 | Ta—60Ni | 1 | 17.5 | A |
| 6-4 | Ta—60Ni | 2 | 17.4 | A |
| 6-4 | Ta—60Ni | 3 | 17.6 | A |
| 6-5 | Ta—60Ni | 5 | 17.5 | A |
| 6-6 | Ta—60Ni | 6 | 16.8 | A |
| 6-7 | Ta—30Ni | 10 | 16.7 | A |
| 6-8 | Ta—30Ni | 0.5 | 16.2 | B |
| 6-9 | Ta—30Ni | 1 | 17.2 | A |
| 6-10 | Ta—30Ni | 2 | 17.4 | A |
| 6-11 | Ta—30Ni | 3 | 17.4 | A |
| 6-12 | Ta—30Ni | 5 | 17.3 | A |
| 6-13 | Ta—30Ni | 6 | 16.9 | A |
| 6-14 | Ta—30Ni | 10 | 16.8 | A |

From the above results, in order for an oxide granular type perpendicular magnetic recording medium to achieve both high media S/N and good corrosion resistance at the same time, it is desirable that the thickness of the seed layer of TaNi alloy or TaTi alloy is in the range from about 1 nm to 5 nm.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A perpendicular magnetic recording medium at least comprising a soft-magnetic underlayer, a seed layer, an intermediate layer, a magnetic recording layer and an overcoat layer which are stacked over a substrate in order,
   wherein said seed layer is made of TaNi alloy or TaTi alloy and said intermediate layer is made of Ru or Ru alloy;
   wherein the thickness of said seed layer is in the range of about 1-5 nm,
   wherein full width at half-maximum $\Delta\theta_{50}$ of the Rocking curves of the Ru (0002) diffraction peak measured with X-ray diffraction is about 4 degrees or less.

2. The perpendicular magnetic recording medium as described in claim 1, wherein said seed layer is made of TaNi alloy which contains Ni in the range from about 20 at. % to 80 at. %.

3. The perpendicular magnetic recording medium as described in claim 1, wherein said seed layer is made of TaTi alloy which contains Ti in the range from about 10 at. % to 40 at. %.

4. The perpendicular magnetic recording medium as described in claim 1, wherein said intermediate layer is made of Ru or Ru alloy which contains about 80 at. % Ru or more.

5. The perpendicular magnetic recording medium as described in claim 1, wherein said magnetic recording layer has a granular structure which includes many columnar grains of CoCrPt alloy and a grain boundary layer containing an oxide.

6. A perpendicular magnetic recording medium comprising:
   a substrate;
   a soft-magnetic underlayer which is formed on said substrate;
   a seed layer of TaNi alloy or TaTi alloy which is formed on said soft-magnetic underlayer;
   a lower intermediate layer of Ru or metal element-added Ru alloy which is deposited on said seed layer at a first gas pressure;
   an upper intermediate layer of Ru or Ru alloy which is deposited on said lower intermediate layer at a second gas pressure higher than said first gas pressure; and
   a magnetic recording layer which is formed on said upper intermediate layer and has a granular structure having many columnar grains of CoCrPt alloy and a grain boundary layer containing an oxide;
   wherein the thickness of said seed layer is in the range of about 1-5 nm, and
   wherein full width at half-maximum $\Delta\theta_{50}$ of the Rocking curves of the Ru (0002) diffraction peak measured with X-ray diffraction is about 4 degrees or less.

7. The perpendicular magnetic recording medium as described in claim 6, wherein said seed layer is made of TaNi alloy which contains Ni in the range from about 20 at. % to 80 at. %.

8. The perpendicular magnetic recording medium as described in claim 6, wherein said seed layer is made of TaTi alloy which contains Ti in the range from about 10 at. % to 40 at. %.

9. A perpendicular magnetic recording medium comprising:
   a substrate;
   a soft-magnetic underlayer which is formed on said substrate;
   a seed layer of TaNi alloy or TaTi alloy which is formed on said soft-magnetic underlayer;
   a lower intermediate layer of Ru or metal element-added Ru alloy which is deposited on said seed layer at a first deposition rate;
   an upper intermediate layer of Ru or Ru alloy which is deposited on said lower intermediate layer at a second deposition rate lower than said first deposition rate; and
   a magnetic recording layer which is formed on said upper intermediate layer and has a granular structure having many columnar grains of CoCrPt alloy and a grain boundary layer containing an oxide;
   wherein the thickness of said seed layer is in the range of about 1-5 nm, and
   wherein full width at half-maximum $\Delta\theta_{50}$ of the Rocking curves of the Ru (0002) diffraction peak measured with X-ray diffraction is about 4 degrees or less.

10. The perpendicular magnetic recording medium as described in claim 9, wherein said seed layer is made of TaNi alloy which contains Ni in the range from about 20 at. % to 80 at. %.

11. The perpendicular magnetic recording medium as described in claim 1, wherein said intermediate layer includes a lower intermediate layer of Ru or metal element-added Ru alloy which is deposited on said seed layer at a first gas pressure; an upper intermediate layer of Ru or Ru alloy which is deposited on said lower intermediate layer at a second gas pressure higher than said first gas pressure.

* * * * *